(12) United States Patent
Sandhu et al.

(10) Patent No.: US 6,830,838 B2
(45) Date of Patent: Dec. 14, 2004

(54) CHEMICAL VAPOR DEPOSITION OF TITANIUM

(75) Inventors: Gurtej Singh Sandhu, Boise, ID (US); Donald L. Westmoreland, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/941,125

(22) Filed: Aug. 28, 2001

(65) Prior Publication Data

US 2002/0000662 A1 Jan. 3, 2002

Related U.S. Application Data

(60) Division of application No. 09/489,187, filed on Jan. 20, 2000, now Pat. No. 6,284,316, which is a continuation-in-part of application No. 09/030,705, filed on Feb. 25, 1998, now Pat. No. 6,143,362.

(51) Int. Cl.⁷ ................................................. B32B 9/00
(52) U.S. Cl. ........................ 428/699; 257/618; 257/623; 428/698
(58) Field of Search .............................. 428/697, 698, 428/699; 257/618, 623, 754, 767, 768, 770

(56) References Cited

U.S. PATENT DOCUMENTS

| | | | |
|---|---|---|---|
| 3,900,312 A | 8/1975 | Terry et al. | 75/68 B |
| 4,340,617 A | 7/1982 | Deutsch et al. | 427/53.1 |
| 4,343,870 A | 8/1982 | Heller et al. | 429/111 |
| 4,359,490 A | 11/1982 | Lehrer | 427/95 |
| 4,713,258 A | 12/1987 | Umemura | 427/35 |
| 4,721,631 A | 1/1988 | Endo et al. | 427/66 |
| 4,751,101 A | 6/1988 | Joshi | 427/39 |
| 4,782,380 A | 11/1988 | Shankar et al. | 257/751 |
| 4,868,005 A | 9/1989 | Ehrlich et al. | 427/53.1 |
| 4,876,112 A | 10/1989 | Kaito et al. | 427/38 |
| 4,884,123 A | 11/1989 | Dixit et al. | 357/71 |
| 4,923,717 A | 5/1990 | Gladfelter et al. | 427/252 |
| 4,957,777 A | 9/1990 | Ilderem et al. | 427/55 |
| 4,971,655 A | 11/1990 | Stefano et al. | 156/659.1 |
| 4,994,410 A * | 2/1991 | Sun et al. | 438/649 |

(List continued on next page.)

FOREIGN PATENT DOCUMENTS

| | | | |
|---|---|---|---|
| EP | 0798777 | 10/1997 | ......... H01L/21/768 |
| JP | 404196419 | 7/1992 | ..................... 21/28 |
| JP | 56995 | 1/1993 | |
| JP | 40-7097679 | 4/1995 | ........... C23C/14/06 |
| JP | 8-176823 | 7/1996 | ........... C23C/16/02 |
| WO | 98/34445 | 8/1998 | ............ H05K/3/26 |

OTHER PUBLICATIONS

Bachman, P., et al., "Plasma–Assisted Chemical Vapor Deposition Processes", *MRS Bulletin*, 52–59, (Dec. 1988).
Bouteville, A., et al., "TiSi2 Selective Growth in a rapid thermal low pressure chemical vapor depositoin system", *Journal of the Electrochemical Society*, 139, 2260–2263, (Aug. 1992).

(List continued on next page.)

*Primary Examiner*—Stephen Stein
*Assistant Examiner*—A B Sperty
(74) *Attorney, Agent, or Firm*—Schwegman, Lundberg, Woessner & Kluth, P.A.

(57) ABSTRACT

A titanium layer is formed on a substrate with chemical vapor deposition (CVD). First, a seed layer is formed on the substrate by combining a first precursor with a reducing agent by CVD. Then, the titanium layer is formed on the substrate by combining a second precursor with the seed layer by CVD. The titanium layer is used to form contacts to active areas of substrate and for the formation of interlevel vias.

29 Claims, 3 Drawing Sheets

U.S. PATENT DOCUMENTS

| | | | |
|---|---|---|---|
| 5,005,519 A | 4/1991 | Egermeier et al. | 118/722 |
| 5,015,330 A | 5/1991 | Okumura et al. | 156/643 |
| 5,022,905 A | 6/1991 | Grundy et al. | 65/60.51 |
| 5,032,233 A | 7/1991 | Yu et al. | 204/192.28 |
| 5,049,975 A | 9/1991 | Ajika et al. | 357/71 |
| 5,124,780 A | 6/1992 | Sandhu et al. | 357/67 |
| 5,136,362 A | 8/1992 | Grief et al. | 357/67 |
| 5,147,819 A | 9/1992 | Yu et al. | 437/173 |
| 5,173,327 A | 12/1992 | Sandhu et al. | 427/573 |
| 5,192,589 A | 3/1993 | Sandhu | 427/255.1 |
| 5,196,360 A | 3/1993 | Doan et al. | 437/41 |
| 5,202,579 A | 4/1993 | Fujii et al. | 257/751 |
| 5,227,331 A | 7/1993 | Westmoreland | 437/174 |
| 5,227,334 A | 7/1993 | Sandhu | 437/190 |
| 5,229,643 A * | 7/1993 | Ohta et al. | 257/706 |
| 5,232,873 A | 8/1993 | Geva et al. | 437/192 |
| 5,239,196 A | 8/1993 | Ikeda et al. | 257/385 |
| 5,240,739 A | 8/1993 | Doan et al. | 427/126.1 |
| 5,246,881 A | 9/1993 | Sandhu et al. | 437/192 |
| 5,252,518 A | 10/1993 | Sandhu et al. | 437/200 |
| 5,254,499 A | 10/1993 | Sandhu et al. | 437/192 |
| 5,258,096 A | 11/1993 | Sandhu et al. | 156/643 |
| 5,273,783 A | 12/1993 | Wanner | 427/250 |
| 5,275,715 A | 1/1994 | Tuttle | 205/123 |
| 5,278,100 A | 1/1994 | Doan et al. | 437/200 |
| 5,306,951 A | 4/1994 | Lee et al. | 257/755 |
| 5,320,880 A | 6/1994 | Sandhu et al. | 427/578 |
| 5,341,016 A | 8/1994 | Prall et al. | 257/412 |
| 5,344,792 A | 9/1994 | Sandhu et al. | 437/200 |
| 5,355,020 A | 10/1994 | Lee et al. | 257/741 |
| 5,374,591 A | 12/1994 | Hasegawa et al. | 437/187 |
| 5,376,405 A | 12/1994 | Doan et al. | 427/126.1 |
| 5,381,302 A | 1/1995 | Sandhu et al. | 361/305 |
| 5,384,284 A | 1/1995 | Doan et al. | 437/190 |
| 5,384,289 A | 1/1995 | Westmoreland | 437/245 |
| 5,391,410 A | 2/1995 | Nii et al. | 427/578 |
| 5,393,564 A | 2/1995 | Westmoreland et al. | 427/248.1 |
| 5,399,379 A | 3/1995 | Sandhu | 427/255.2 |
| 5,401,674 A | 3/1995 | Anjum et al. | 437/190 |
| 5,416,045 A | 5/1995 | Kauffman et al. | 437/174 |
| 5,425,392 A | 6/1995 | Thakur et al. | 437/173 |
| 5,444,018 A * | 8/1995 | Yost et al. | 438/649 |
| 5,453,640 A | 9/1995 | Kinoshita | 257/629 |
| 5,459,353 A | 10/1995 | Kanazawa | 257/751 |
| 5,496,762 A | 3/1996 | Sandhu et al. | 437/60 |
| 5,506,166 A | 4/1996 | Sandhu et al. | 437/60 |
| 5,508,066 A | 4/1996 | Akahori | 427/571 |
| 5,534,716 A | 7/1996 | Takemura | 257/72 |
| 5,567,243 A | 10/1996 | Foster et al. | 118/730 |
| 5,571,572 A | 11/1996 | Sandhu | 427/585 |
| 5,575,708 A | 11/1996 | Chau et al. | 451/305 |
| 5,595,784 A | 1/1997 | Kaim et al. | 427/255.2 |
| 5,607,722 A | 3/1997 | Vaartstra et al. | 427/248.1 |
| 5,633,200 A | 5/1997 | Hu | 438/653 |
| 5,641,545 A | 6/1997 | Sandhu | 427/573 |
| 5,644,166 A * | 7/1997 | Honeycutt et al. | 257/754 |
| 5,693,557 A | 12/1997 | Hirao et al. | 437/60 |
| 5,725,739 A | 3/1998 | Hu | 204/192.3 |
| 5,747,116 A | 5/1998 | Sharan et al. | 427/534 |
| 5,773,890 A | 6/1998 | Uchiyama et al. | 257/753 |
| 5,828,131 A | 10/1998 | Cabral, Jr. et al. | 257/757 |
| 5,834,371 A | 11/1998 | Ameen et al. | 438/656 |
| 5,838,052 A | 11/1998 | McTeer | 257/437 |
| 5,846,881 A * | 12/1998 | Sandhu et al. | 438/683 |
| 5,924,012 A | 7/1999 | Vaarstra | 438/681 |
| 5,956,595 A | 9/1999 | Zenke | 438/398 |
| 5,970,309 A * | 10/1999 | Ha et al. | 438/3 |
| 5,973,402 A | 10/1999 | Shinriki et al. | 257/768 |
| 5,976,976 A | 11/1999 | Doan et al. | 438/683 |
| 6,016,012 A | 1/2000 | Chatila et al. | 257/775 |
| 6,031,288 A | 2/2000 | Todorobaru et al. | 257/754 |
| 6,120,844 A | 9/2000 | Chen et al. | 427/255.28 |
| 6,140,230 A | 10/2000 | Li | 438/653 |
| 6,143,362 A | 11/2000 | Sandhu et al. | 427/255.391 |
| 6,143,649 A | 11/2000 | Tang | 438/640 |
| 6,153,490 A | 11/2000 | Xing et al. | 438/396 |
| 6,208,033 B1 | 3/2001 | Doan et al. | 257/770 |
| 6,217,721 B1 | 4/2001 | Xu et al. | 204/192.17 |
| 6,255,216 B1 | 7/2001 | Doan et al. | 438/683 |
| 6,294,469 B1 | 9/2001 | Kulkami et al. | 438/689 |
| 6,320,213 B1 * | 11/2001 | Kirlin et al. | 257/295 |
| 6,433,434 B1 * | 8/2002 | Sandhu et al. | 257/764 |
| 6,605,533 B2 | 8/2003 | Trivedi | |
| 2001/0042505 A1 | 11/2001 | Vaarstra | 117/104 |
| 2002/0000662 A1 | 1/2002 | Sandhu et al. | 257/754 |

OTHER PUBLICATIONS

Cowher, M., et al., "Low Temperature CVD Garnet Growth", *Journal of Crystal Growth*, 46, 399–402, (1997), no month.

Engqvist, J., et al., "Selective deposition of TiSi2 from H2–TiCl4 Gas mixtures and si: Aspects of Thermodynamics including Critical evaluation of thermochemical data in the Ti–Si System", *Journal of the Electrochemical Society*, 139, 3197–3205, (Nov. 1992).

Esquivel, A., et al., "Electrical and Physical Characteristics of Dry Oxygen, High Pressure Oxidation for SUB–0.5 um CMOS Isolation", *Abst. Int'l Electron Devices Meeting*, (1994), no month.

Herman, I., "Laser–Assisted Deposition of Thin Films from Gas–Phase and Surface–Adsorbed Molecules", *Chem. Rev.*, 89, 1323, 1346–1349, (1989), no month.

Ilderem, V., et al., "Optimized Deposition Parameters for Low Pressure Chemical Vapor Deposited Titanium Silicide", *J. Electrochemical Soc. : Solid State Science and Technology*, 2590–2596, (Oct. 1988).

Lee, J., et al., "Plasma enhanced chemical vapor deposition of blanket TiSi2 on oxide patterned wafers", *Journal of the Electrochemical Society*, 139, 1159–1165, (Apr. 1992).

Lie, L., et al., "High Pressure Oxidation of Silicon in Dry Oxygen", *J. Electrochemical Soc. : Solid State Science and Technology*, 129, 2828–2834, (Dec. 1982).

Moeller, T., et al., "Semiconductor Elements, Ch. 30", In: *Chemistry with Inorganic Qualitative Analysis*, 2nd Edition, Academic Press, 995–996, (1984), no month.

Morosanu, C., *Thin Films by Chemical Vapor Deposition*, Elsevier, N.Y., 42–54 & 460–475, (1990), no month.

Panson, A., et al., "Chemical Vapor Deposition of YBa(2)Cu(3)O(7) Using Metalorganic Chelate Precursors", *Appl. Phys. Lett.*, 53, 1756–1758, (Oct. 1988).

Rosler, R., et al., "Plasma–Enhanced CVD of Titanium Silicide", *J. Vacuum Science Tech.*, B2(4), 733–737, (Oct./Dec. 198).

Wolf, S., *Silicon Processing for the VLSI Era, vol. 2: Process Integration*, Lattice Press, Sunset Beach, California, 202–203, (1990), no month.

Yu, M., et al., "Surface Chemistry of the WF(6)—Based Chemical Vapor Deposition of Tungsten", *IBM J. Research Development*, 34, 875–883, (Nov. 1990).

\* cited by examiner

CHEMICAL VAPOR DEPOSITION OF TITANIUM

RELATED APPLICATIONS

This application is a Divisional of U.S. application Ser. No. 09/489,187, filed on Jan. 20, 2000, now U.S. Pat. No. 6,284,316 which is a continuation-in-part of U.S. application Ser. No. 09/030,705, filed Feb. 25, 1998, now issued as U.S. Pat. No. 6,143,362 on Nov. 7, 2000, which is hereby incorporated by reference in its entirety.

FIELD OF THE INVENTION

The present invention relates to a method for manufacturing semiconductor devices, and more particularly, to a method for depositing titanium layers on a substrate.

BACKGROUND OF THE INVENTION

Device density in integrated circuits (ICs) is constantly being increased. To enable the increase in density, device dimensions are being reduced. As the dimensions of device contacts get smaller, device contact resistance increases, and device performance is adversely affected. Methods for decreasing device contact resistance in ICs are needed to obtain enhanced device and IC performance.

Device contacts with reduced resistance may be created by forming certain metals on a silicon semiconductor base layer. These metals react with the underlying silicon, for example, to form suicides. Silicide device contacts are desirable because they reduce the native oxide on silicon. The native oxide is undesirable because it increases the contact resistance.

In one embodiment, titanium is used to form silicide device contacts for two reasons. First, titanium silicide has superior gettering qualities. Also, titanium silicide forms low resistance contacts on both polysilicon and single-crystal silicon.

Titanium silicide device contacts are normally formed with the following process. First, a thin layer of titanium is formed on top of the silicon base layer, such as a substrate. The titanium adjoins active regions exposed by contact holes in an isolating layer, such as an oxide, above the silicon base layer. Then, the silicon base layer is annealed. As a result, the titanium reacts with the active regions of silicon to form titanium silicide.

However, because titanium cannot be readily deposited in a pure form, additional processing steps are required to form titanium silicide device contacts. Titanium precursors, such as titanium tetrachloride, are commonly available and can be used to form titanium. Titanium tetrachloride, though, can only be reduced at temperatures exceeding 1000 degrees Celsius with certain reducing agents. At these temperatures, the silicon base layer will be damaged. Therefore, there is a need for a method of forming titanium from titanium precursors at lower temperatures.

Furthermore, the resistance of device contacts can be adversely increased by conductive layers coupled between the device contacts and other components. The conductive layers may be formed by the same metal layer used to form the device contacts. As device dimensions shrink, the contact holes become relatively deeper and narrower. Also, the walls of the contact holes become steeper, and closer to vertical. As a result, most metal deposition techniques form conductive layers having relatively small step coverage, and hence relatively high resistance. Step coverage is the ratio of the minimum thickness of a film as it crosses a step, to the nominal thickness of the film on flat regions, where thickness is generally measured perpendicular to the surfaces of the step and flat regions, and where the resultant value is usually expressed as a percentage. Thus, the effective contact resistance is increased at lower values of step coverage. Therefore, there is also a need for a method of forming conductive layers having increased step coverage to reduce effective device contact resistance.

Conformal layers of titanium having good step coverage have been previously formed at lower temperatures with chemical vapor deposition. Such techniques are disclosed in U.S. Pat. Nos. 5,173,327, 5,273,783 and 5,278,100, which are hereby incorporated by reference. However, alternative, effective and efficient techniques for forming titanium films are desired.

SUMMARY OF THE INVENTION

The present invention provides a method, and a corresponding resulting structure, for forming conformal titanium films supported on a substrate of an integrated circuit (IC) by forming a seed layer supported by the substrate, and then reducing a titanium precursor with the seed layer. In one embodiment, the seed layer comprises a main group element selected from the group consisting of zinc, cadmium, mercury, aluminum, gallium, indium, tin, silicon, germanium, lead, arsenic and antimony. The seed layer is formed by combining a first precursor and a reducing agent by chemical vapor deposition (CVD). Then, titanium is formed by combining a second precursor with the seed layer by CVD.

In another embodiment, the present invention may further comprise the step of annealing the titanium to form titanium silicide.

In another embodiment, forming the seed layer further comprises forming a seed layer according to the following chemical process (I):

$$MR_x + H_2 \rightarrow M + \text{alkanes},$$

wherein:

M is a main group element selected from the group consisting of zinc, cadmium, mercury, aluminum, gallium, indium, tin, silicon, germanium, lead, arsenic and antimony;

R is an alkyl group; and x is some integer value determined by the valence of M.

In one embodiment, chemical process (I) is performed at a temperature between approximately 100 and 600 degrees Celsius.

In yet another embodiment, the step of forming titanium further comprises the step of combining the seed layer with the second precursor that is titanium tetrachloride according to the following chemical process (II):

$$TiCl_4 + M \rightarrow Ti + MCl_x.$$

In one embodiment, chemical process (II) is performed at a temperature between approximately 100 and 600 degrees Celsius.

In yet another embodiment, titanium may be formed in a single step according to the following chemical process (III):

$$TiCl_4 + M \text{ (source)} \rightarrow Ti + MCl_x$$

In one embodiment, chemical process (III) is performed at a temperature between approximately 100 and 700 degrees Celsius.

In yet a further embodiment, the present invention may be an IC comprising a layer of a titanium alloy, coupled to a titanium silicide contact. In yet another embodiment, the present invention may be a memory comprising a memory array operatively coupled to a control circuit and an I/O circuit. The memory array, control circuit and I/O circuit comprise a layer of a titanium alloy coupled to titanium silicide contacts. In yet another embodiment, the titanium alloy may comprise titanium and an element selected from the group consisting of zinc, cadmium, mercury, aluminum, gallium, indium, tin, silicon, germanium, lead, arsenic and antimony. In still another embodiment, the titanium alloy may comprise titanium and zinc.

It is a benefit of the present invention that high step coverage metal layers can be formed. Further features and advantages of the present invention, as well as the structure and operations of various embodiments of the present invention, are described in detail below with reference to the accompanying drawings.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable persons skilled in the art to practice the invention, and it is to be understood that other embodiments may be utilized and that logical, mechanical and electrical changes may be made without departing from the spirit and scope of the present invention. The terms wafer and substrate used in the following description include any semiconductor-based structure having an exposed surface with which to form the integrated circuit structure of the invention. Wafer and substrate are used interchangeably to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The following detailed description is, therefore, not to be taken in a limiting sense, and the scope of the present invention is defined only by the appended claims.

The subsequently described methods will be in the context of using zinc as a metal seed layer. However, other seed layers are suitable for use with the various embodiments of the invention, as will be described.

Figure 1A:
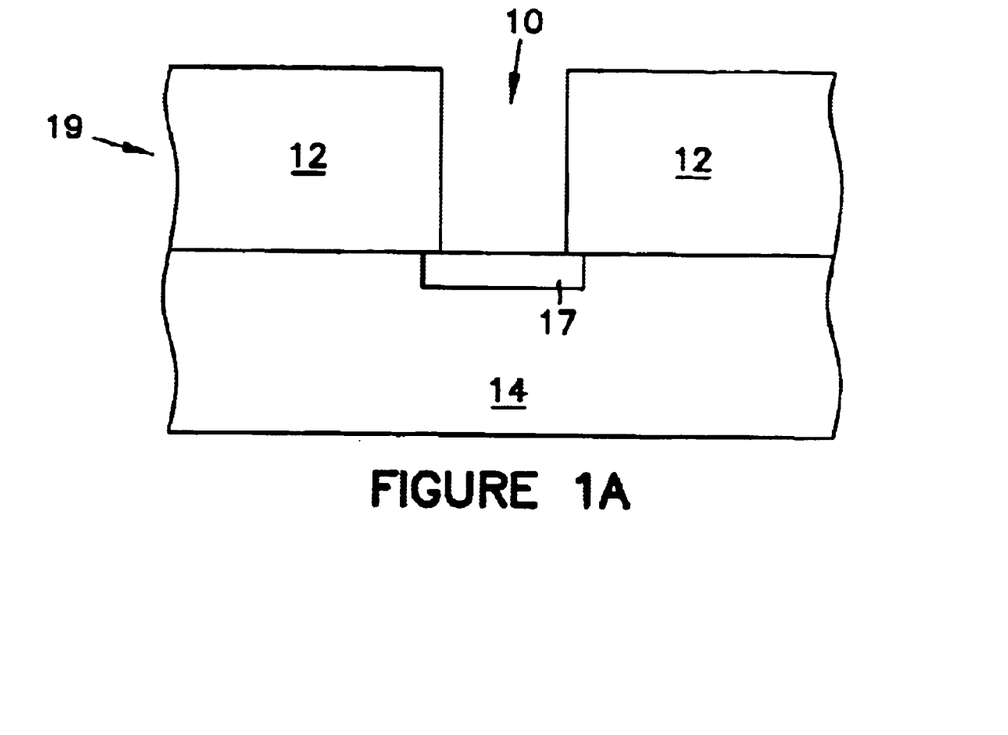
FIG. 1A is a cross-sectional view of a contact hole that has been etched through an insulative layer to an underlying semiconductor substrate.

In order to manufacture a device contact in an integrated circuit 19, a contact hole 10, as shown in FIG. 1A, is etched through an insulating layer 12, such as borophosphosilicate glass (BPSG) or silicon dioxide ($SiO_2$). As a result, an active region 17 of underlying semiconductor base layer or substrate 14, is exposed. A device contact is then formed on the exposed active region 17 in the following manner.

Figure 1B:
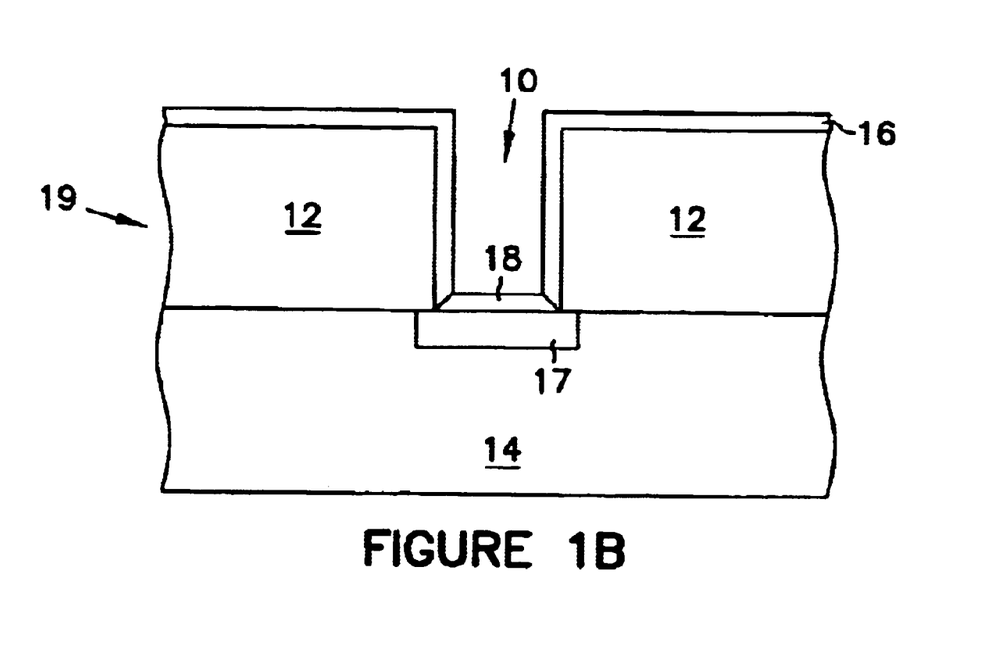
FIG. 1B is a cross-sectional view of the contact hole of FIG. 1A, comprising titanium and titanium silicide film.

Chemical vapor deposition (CVD) is used to form a conformal layer of titanium or titanium alloy on the integrated circuit 19 by a subsequently described method. CVD is further described in U.S. Pat. No. 5,278,100. In one embodiment, the conformal layer has a step coverage of at least one hundred percent in the contact hole 10, even for a high aspect ratio contact hole (i.e., a contact hole that is much deeper than it is wide). As a result, a low resistance layer of titanium or titanium alloy 16 is formed on the insulating layer 12, as shown in FIG. 1B. A portion of the layer 16 is formed as a low resistance device contact 18 of titanium silicide over the active region 17.

Figure 2:
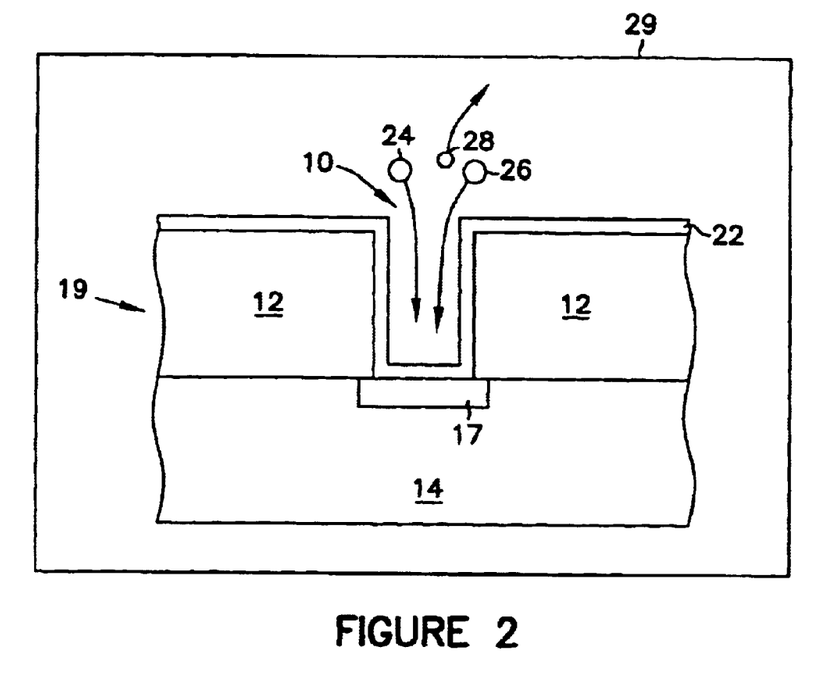
FIG. 2 is a cross-sectional view of the contact hole of FIG. 1A, comprising a film of second reducing agent.

In another embodiment, a cold wall-hot substrate reactor is used to form the conformal layer of titanium or titanium alloy. In one embodiment, a cold wall-hot substrate reactor is used for blanket depositions as this design is efficient in regard to precursor consumption. In one embodiment, first, a conformal film of a seed layer 22 comprising zinc is deposited on the insulator 12 and substrate 14, as shown in FIG. 2. The seed layer 22 is formed with CVD by combining a first reducing agent 24 with a first precursor 26, which are injected into the CVD reactor which is represented in block form at 29. In another embodiment, the seed layer 22 that is zinc may be formed by combining a first precursor 26 that is a dialkyl zinc or trimethyl zinc compound with a reducing agent 24 that is hydrogen.

When performing this step, the integrated circuit 19 is mounted on a substrate holder in the CVD reactor 29. The substrate 14 is heated to a temperature within a range of approximately 100 to 600 degrees Celsius and at a pressure approximately between 1 millitorr and 1 atmosphere. Alternatively, the temperature may range from approximately 300 to 550 degrees Celsius, or approximately 350 to 450 degrees Celsius. In one embodiment, the temperature is approximately 400 degrees Celsius. Also, alternatively, the pressure may range from approximately 10 millitorr to 100 torr. In one embodiment, the pressure is approximately 1 torr. A carrier gas of helium, argon or nitrogen may be used at a flow rate of between approximately 1 and 200 sccm. Alternatively, the flow rate may range between approximately 20 sccm and 1 liter. In one embodiment, the pressure is approximately 200 sccm. The first precursor 26 and the reducing agent 24 contact the heated silicon base layer and insulating layer 12, and form the seed layer 22 on the integrated circuit 19. This chemical process (I) is exemplified below:

$ZnR_2(gas)+H_2(gas) \rightarrow Zn\ (solid)+alkanes\ (gas)$,  (I)

where R is an alkyl group.

First reaction products 28, such as gaseous alkanes, resulting from the formation of the seed layer 22 exit from the CVD reactor 29 through an exhaust manifold. The thickness of the seed layer 22 formed on the integrated circuit 19 is between approximately 5 and 50 angstroms. However, the present invention envisions forming a seed layer 22 that is thicker.

Figure 3A:
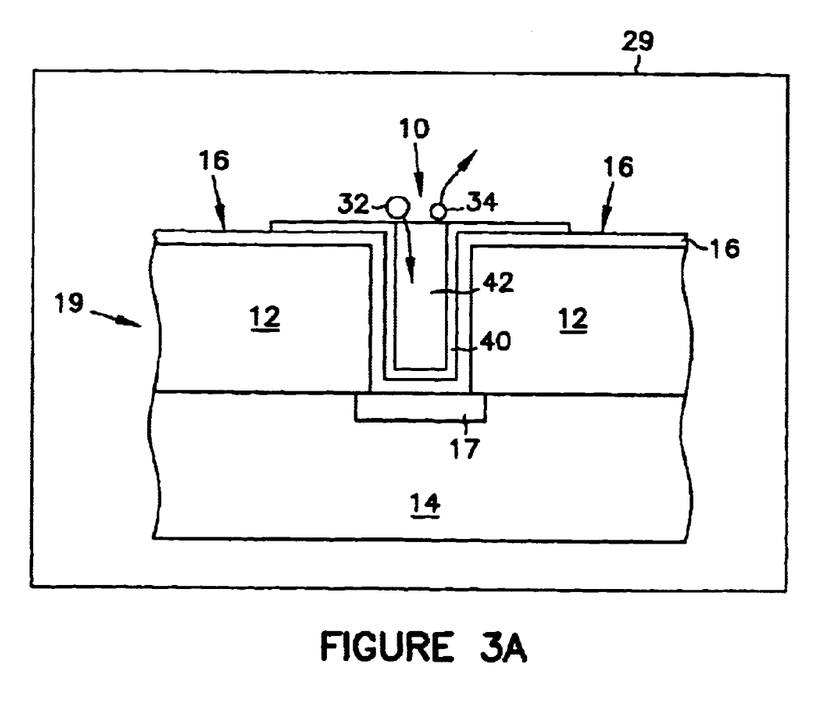
FIG. 3A is a cross-sectional view of a contact hole as in FIG. 1A, including additional structures according to an embodiment of the invention.

Next, the seed layer 22 is converted to a layer 16 of titanium or a titanium alloy. As illustrated in FIG. 3A, a titanium precursor 32, such as titanium tetrachloride, is combined with the seed layer 22 by CVD to form a conformal layer 16 of titanium or titanium alloy in lieu of the seed layer 22.

When performing this step, the integrated circuit 19 is mounted and heated in the CVD reactor 29 to a temperature within a range of approximately 100 to 600 degrees Celsius and at a pressure approximately between 1 millitorr and 1 atmosphere. Alternatively, the temperature may range from approximately 100 to 700 degrees Celsius, approximately 300 to 550 degrees Celsius, or approximately 350 to 450 degrees Celsius. In one embodiment, the temperature is approximately 400 degrees Celsius. Also, alternatively, the pressure may range from approximately 10 millitorr to 100 torr. In one embodiment, the pressure is approximately 1 torr. A carrier gas of helium, argon or nitrogen may be used at a flow of between approximately 1 and 200 sccm. Alternatively, the flow rate may range between approximately 20 sccm and 1 liter. In one embodiment, the pressure is approximately 200 sccm. When the titanium precursor 32 contacts the seed layer 22 on the integrated circuit 19, the compounds form a conformal layer 16 of titanium or a titanium alloy. The chemical process (II) is exemplified below:

$$TiCl_4(gas)+Zn\ (solid) \rightarrow Ti\ (solid)+ZnCl_2(gas) \qquad (II)$$

Second reaction products 34 resulting from the formation of the titanium or titanium alloy exit from the CVD reactor 29 through the exhaust manifold. Part or all of the seed layer 22 is converted to a layer 16 of titanium or titanium alloy. If this process step is conducted for a sufficient period of time, all of the seed layer 22 will be converted to a layer 16 of titanium. However, if not all of the seed layer 22 is converted to a layer 16 of titanium, a layer 16 of titanium alloy, including the seed layer 22, will be formed on the integrated circuit 19. These steps may be repeated to form thicker layers.

In another embodiment, the layer 16 of titanium or titanium alloy can be formed during a single CVD step, as exemplified by chemical process (III) below:

$$TiCl_4+Zn(source) \rightarrow Ti+ZnCl_2 \qquad (III)$$

The zinc can be provided from one of many types of sources, including gaseous and solid sources. In one embodiment of such a single CVD step, the seed and titanium layers 22, 16 can be formed substantially simultaneously. The titanium or titanium alloy layer 16 can be formed by combining a first precursor 26, such as a dialkyl or trimethyl zinc compound, with a reducing agent 24, such as hydrogen, and a titanium precursor 32, such as titanium tetrachloride. When performing the CVD step, the integrated circuit 19 is mounted and heated in the CVD reactor 29 to a temperature within a range of approximately 100 to 600 degrees Celsius at a pressure of approximately between 1 millitorr and 1 atmosphere. Alternatively, the temperature may range from approximately 100 to 700 degrees Celsius, approximately 300 to 550 degrees Celsius, or approximately 350 to 450 degrees Celsius. In one embodiment, the temperature is approximately 400 degrees Celsius. Also, alternatively, the pressure may range from approximately 10 millitorr to 100 torr. In one embodiment, the pressure is approximately 1 torr. A carrier gas of helium, argon or nitrogen may be used at a flow rate of between approximately 1 and 200 sccm. Alternatively, the flow rate may range between approximately 20 sccm and 1 liter. In one embodiment, the pressure is approximately 200 sccm. When the first precursor 26 and the reducing agent 24 contact the heated silicon base layer and insulating layer 12, they form the seed layer 22 on the integrated circuit 19. Then, when the titanium precursor 32 contacts the seed layer 22, a conformal layer 16 of titanium or titanium alloy is formed on the integrated circuit. The resulting layer 16 of titanium or titanium alloy has a thickness between approximately 5 and 50 angstroms. However, the present invention envisions forming a thicker layer 16 of titanium or titanium alloy. The chemical process (IV) is exemplified below:

$$ZnR_2(gas)+H_2(gas)+TiCl_4(gas) \rightarrow Ti\ (solid)+ZnCl_2(gas)+alkanes\ (gas), \qquad (IV)$$

where R is an alkyl group.

The reaction products 28, 34 exit from the CVD reactor 29 through the exhaust manifold.

Subsequently, the integrated circuit 19 is annealed at a temperature of between approximately 250 to 750 degrees Celsius. Alternatively, the temperature may range from approximately 250 to 800 degrees Celsius. In one embodiment, the temperature is approximately 700 degrees Celsius. As a result, the titanium in the layer 16 of titanium or titanium alloy proximate to the silicon is converted to titanium silicide (TiSi, TiSi$_2$, Ti$_3$Si$_5$ or combinations thereof) to form the low resistance device contact 18. For via level applications, the anneal is not required. The via comprises a tungsten or aluminum fill 42 on top of the layer 16 which is formed on top of a conductor (also represented by reference number 17) with an optional TiN layer 40 between layer 16 and the fill material 42.

In yet another embodiment, the low resistance device contact 18 of titanium silicide may be formed over the active region 17 when the layer 16 of titanium or titanium alloy is formed by CVD on the integrated circuit 19 at a temperature of between approximately 250 to 750 degrees Celsius. Alternatively, the temperature may range from approximately 250 to 800 degrees Celsius. In one embodiment, the temperature is approximately 700 degrees Celsius. Upon device contact 18 formation, additional metal layers, such as titanium nitride and tungsten, may be subsequently formed over the device contact 18 and layer 16 of titanium or titanium alloy.

Figure 3B:
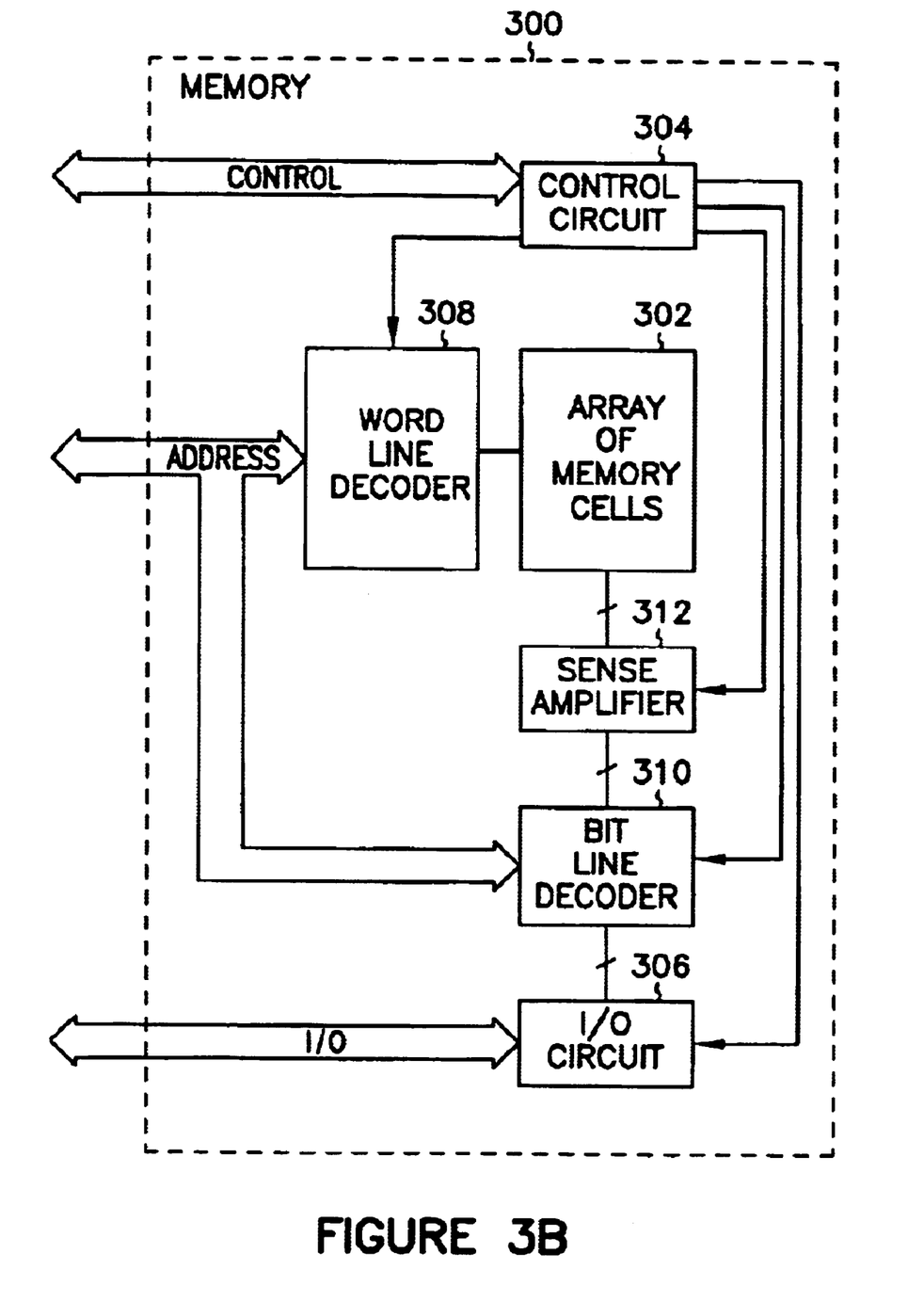
FIG. 3B is a block diagram of a memory.

In another embodiment, the integrated circuit 19 is a memory 300 in FIG. 3B, such as a dynamic random access memory. The memory 300 may include an array of memory cells 302, control circuit 304, I/O circuit, word line decoder 308, digit, or bit, line decoder 310, and sense amplifier 312 coupled in a manner known to one skilled in the art. Each of the aforementioned elements of the memory 300 includes contacts 18 and layers 16 of titanium, or titanium alloy, formed in the manner described above.

As noted above, other seed layers are suitable for use with the various embodiments of the invention. In one embodiment, the first precursor 26 is an alkane of the form MR$_x$, where M is an element selected from the group consisting of zinc, cadmium, mercury, aluminum, gallium, indium, tin, silicon, germanium, lead, arsenic and antimony; R is an alkyl group; and x is some integer value determined by the valence of M. The value of x is generally equal to a valence of M, e.g.,when M has a valence of 3 as does aluminum, x equals 3. M may be capable of having more than one valence. Such alkane precursors may be used to form the seed layer 22. Chemical process (I) for the formation of seed layer 22 may then be written in its more general form:

$$MR_x(gas)+H_2(gas) \rightarrow M\ (solid)+alkanes\ (gas), \qquad (I)$$

wherein:

M is an element selected from the group consisting of zinc, cadmium, mercury, aluminum, gallium, indium, tin, silicon, germanium, lead, arsenic and antimony;

R is an alkyl group; and x is some integer value equal to the valence of M.

In similar fashion, chemical process (II) for the formation of the layer 16 of titanium or titanium alloy may be written more generally as:

$$\text{TiCl}_4(\text{gas}) + \text{M (solid)} \rightarrow \text{Ti(solid)} + \text{MCl}_x(\text{gas}) \qquad \text{(II)}$$

wherein:

M is an element selected from the group consisting of zinc, cadmium, mercury, aluminum, gallium, indium, tin, silicon, germanium, lead, arsenic and antimony; and x is some integer value equal to the valence of M.

In another embodiment, where the formation of the layer 16 of titanium or titanium alloy is performed in a single step, chemical process (III) may be written more generally as:

$$\text{TiCl}_4 + \text{M(source)} \rightarrow \text{Ti} + \text{MCl}_x \qquad \text{(III)}$$

wherein:

M is an element selected from the group consisting of zinc, cadmium, mercury, aluminum, gallium, indium, tin, silicon, germanium, lead, arsenic and antimony; and x is some integer value equal to the valence of M.

In a further embodiment, where the formation of the layer 16 of titanium or titanium alloy is performed in a single CVD step, chemical process (I) may be written more generally as:

$$\text{MR}_x(\text{gas}) + \text{H}_2(\text{gas}) + \text{TiCl}_4(\text{gas}) \rightarrow \text{Ti(solid)} + \text{MCl}_x(\text{gas}) + \text{alkanes(gas)}, \qquad \text{(IV)}$$

wherein:

M is an element selected from the group consisting of zinc, cadmium, mercury, aluminum, gallium, indium, tin, silicon, germanium, lead, arsenic and antimony;

R is an alkyl group; and x is some integer value equal to the valence of M.

The various embodiments of the present invention provide high step coverage, low resistivity titanium silicide device contacts to silicon, or titanium contacts to metal at the via level, formed at a relatively low temperature. Use of the various alkane precursors permits formation of a titanium layer without depletion of an underlying silicon or other base layer.

It is to be understood that the above description is intended to be illustrative, and not restrictive. Many other embodiments will be apparent to those of skill in the art upon reviewing the above description. For example, other titanium precursors, such as tetradimethyl amino titanium (TDMAT) can be used to form layers 16 and device contacts 18. Additionally, the present invention may be implemented with any CVD apparatus 29, including hot wall reactors, cold wall reactors, radiation beam assisted reactors, plasma-assisted reactors, and the like. Furthermore, the seed layer 22 may be formed in any manner which provides a desired thickness film. Hence, the scope of the invention should, therefore, be determined with reference to the appended claims, along with the full scope of equivalents to which such claims are entitled.

What is claimed is:

1. A via, comprising:

a continuous electrically conductive, titanium alloy layer formed overlying walls and an exposed base layer of a contact hole, the titanium alloy layer having a composition that is uniform in walls and a base portion of the titanium alloy layer;

a barrier layer coupled to the titanium alloy layer; and a fill coupled to the barrier layer, wherein the fill comprises a metal selected from the group consisting of tungsten and aluminum.

2. The via of claim 1, wherein the titanium alloy layer comprises titanium and zinc.

3. A via, comprising:

a continuous electrically conductive, titanium alloy layer formed overlying walls and an exposed base layer of a contact hole, the titanium alloy layer having a composition that is uniform in walls and a base portion of the titanium alloy layer, wherein the titanium alloy layer comprises titanium and an element selected from the group consisting of zinc, cadmium, mercury, aluminum, gallium, indium, tin, silicon, germanium, lead, arsenic and antimony;

a barrier layer coupled to the titanium alloy layer; and a fill coupled to the barrier layer, wherein the fill comprises a metal selected from the group consisting of tungsten and aluminum.

4. The via of claim 1, wherein the barrier layer includes a titanium nitride layer interposed between the titanium alloy layer and the fill.

5. A via comprising:

a continuous electrically conductive, titanium alloy layer formed overlying walls and an exposed base layer of a contact hole, the titanium alloy layer having a composition that is uniform in walls and a base portion of the titanium alloy layer;

a fill comprising a metal selected from the group consisting of tungsten and aluminum; and a titanium nitride layer interposed between the titanium alloy layer and the fill.

6. A via, comprising:

a continuous electrically conductive, titanium alloy layer formed overlying walls and an exposed base layer of a contact hole, the titanium alloy layer having a composition that is uniform in walls and a base portion of the titanium alloy layer, wherein the titanium alloy layer comprises titanium and an element selected from the group consisting of zinc, cadmium, mercury, aluminum, gallium, indium, tin, silicon, germanium, lead, arsenic and antimony;

a fill comprising a metal selected from the group consisting of tungsten and aluminum; and a titanium nitride layer interposed between the titanium alloy layer and the fill.

7. A via, comprising:

a first layer of a continuous electrically conductive, titanium alloy within a contact opening in an insulating layer, the first layer having a composition that is uniform in walls and a base portion of the first layer, wherein the titanium alloy comprises titanium and an element selected from the group consisting of zinc, cadmium, mercury, aluminum, gallium, indium, tin, silicon, germanium, lead, arsenic and antimony;

a second layer of titanium silicide coupled to the first layer; and a fill coupled to the titanium alloy layer, wherein the fill comprises a metal selected from the group consisting of tungsten and aluminum.

8. The via of claim 7, wherein the first layer includes a titanium zinc alloy.

9. The via of claim 7, further including a titanium nitride layer interposed between the titanium alloy layer and the fill.

10. The via of claim 7, wherein the first layer is coupled to a sidewall of the contact opening.

11. The via of claim 7, wherein the second layer is coupled to an exposed semiconductor surface.

12. The via of claim 7, wherein the contact opening includes a high aspect ratio contact opening.

13. A via, comprising:
   a first layer of a continuous electrically conductive, titanium alloy within a high aspect ratio contact opening in an insulating layer, the first layer having a composition that is uniform in walls and a base portion of the first layer, wherein the titanium alloy comprises titanium and an element selected from the group consisting of zinc, cadmium, mercury, aluminum, gallium, indium, tin, silicon, germanium, lead, arsenic and antimony;
   a second layer of titanium silicide coupled to the first layer; and
   a fill coupled to the titanium alloy layer, wherein the fill comprises a metal selected from the group consisting of tungsten and aluminum.

14. The via of claim 13, wherein the first layer includes a titanium zinc alloy.

15. The via of claim 13, further including a titanium nitride layer interposed between the titanium alloy layer and the fill.

16. The via of claim 13, wherein insulating layer includes borophosphous silicate glass (BPSG).

17. The via of claim 13, wherein the insulating layer includes silicon dioxide (SiO2).

18. The via of claim 13, wherein the first layer is coupled to a sidewall of the high aspect ratio contact opening.

19. The via of claim 13, wherein the second layer is coupled to an exposed semiconductor surface.

20. A via, comprising:
   a first layer of an electrically conductive, titanium zinc alloy on a sidewall of a high aspect ratio contact opening in an insulating layer;
   a second layer of titanium silicide formed overlying an exposed semiconductor base layer of the contact hole;
   a fill coupled to the titanium zinc alloy layer, wherein the fill comprises a metal selected from the group consisting of tungsten and aluminum.

21. The via of claim 20, further including a titanium nitride layer interposed between the titanium zinc alloy layer and the fill.

22. The via of claim 20, wherein the insulating layer includes borophosphous silicate glass (BPSG).

23. The via of claim 20, wherein the insulating layer includes silicon dioxide (SiO2).

24. A via, comprising:
   a first layer of an electrically conductive, titanium zinc alloy within a contact opening in an insulating layer, wherein the first layer is produced using a method including:
   forming a seed layer supported by a substrate by combining a first precursor with a first reducing agent;
   forming the titanium layer supported by the substrate by combining a titanium-containing precursor with the seed layer; and
   filling the remaining space of the contact opening with a metal selected from the group consisting of tungsten and aluminum.

25. The via of claim 24, further including a second layer of titanium silicide coupled to the titanium zinc alloy.

26. The via of claim 24, further including a titanium nitride layer interposed between the first layer and the fill.

27. The via of claim 25, further including a titanium nitride layer interposed between the second layer and the fill.

28. The via of claim 24, wherein the first layer is coupled to a sidewall of the contact opening.

29. The via of claim 24, wherein the first layer is coupled to a high aspect ratio contact opening.

* * * * *

UNITED STATES PATENT AND TRADEMARK OFFICE
CERTIFICATE OF CORRECTION

PATENT NO. : 6,830,838 B2
DATED : December 14, 2004
INVENTOR(S) : Sandhu et al.

It is certified that error appears in the above-identified patent and that said Letters Patent is hereby corrected as shown below:

Title page,
Item [56], References Cited, OTHER PUBLICATIONS,
"Bachman, P., et al.," reference, delete "Bachman" and insert -- Bachmann --, therefor.
"Bouteville, A., et al.," reference, delete "TiSi2" and insert -- $TiSi_2$ --, therefor; and delete "depositoin" and insert -- deposition --, therefor.
"Cowher, M., et al.," reference, delete (1997)" and insert -- (1979) --, therefor.
"Engqvist, J., et al.," reference, delete "TiSi2" and insert -- $TiSi_2$ --, therefor; delete "H2-TiCl4" and insert -- $H_2\_TiCl_4$ --, therefor; and after 'and", delete "si:" and insert -- Si: --, therefor.
"Lee, J., et al.," reference, delete "TiSi2" and insert -- $TiSi_2$ --, therefor.
"Moeller, T., et al.," reference, delete "Semiconductor" and insert
-- Semiconducting --, therefor.
"Rosler, R., et al.," reference, delete "198" and insert -- 1988 --, therefor.

Column 1,
Line 29, delete "suicides" and insert -- suicides --, therefor.

Column 7,
Line 29, delete "(I)" and insert -- (IV) --, therefor.

Column 8,
Line 27, after "via" insert -- , --.

Column 9,
Line 29, after "wherein" insert -- the --.
Line 32, delete "(SiO2)" and insert -- $(SiO_2)$ --, therefor.

UNITED STATES PATENT AND TRADEMARK OFFICE
CERTIFICATE OF CORRECTION

PATENT NO. : 6,830,838 B2
DATED : December 14, 2004
INVENTOR(S) : Sandhu et al.

It is certified that error appears in the above-identified patent and that said Letters Patent is hereby corrected as shown below:

<u>Column 10,</u>
Line 13, delete "(SiO2)" and insert -- $(SiO_2)$ --, therefor.

Signed and Sealed this

Tenth Day of May, 2005

JON W. DUDAS
*Director of the United States Patent and Trademark Office*